United States Patent
Liu et al.

(10) Patent No.: US 10,122,411 B2
(45) Date of Patent: Nov. 6, 2018

(54) COMMUNICATIONS DEVICE AND BOARD USED IN COMMUNICATIONS DEVICE

(71) Applicant: Huawei Technologies Co., Ltd., Shenzhen (CN)

(72) Inventors: Changyi Liu, Shenzhen (CN); Xudong Fei, Shenzhen (CN); Xidong Yao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/643,235

(22) Filed: Jul. 6, 2017

(65) Prior Publication Data

US 2017/0310363 A1    Oct. 26, 2017

Related U.S. Application Data

(63) Continuation of application No. PCT/CN2016/070301, filed on Jan. 6, 2016.

(30) Foreign Application Priority Data

Jan. 6, 2015   (CN) .......................... 2015 1 0005712

(51) Int. Cl.
*H04B 3/54*       (2006.01)
*G06F 1/18*       (2006.01)
(Continued)

(52) U.S. Cl.
CPC ................. *H04B 3/54* (2013.01); *G06F 1/18* (2013.01); *G06F 1/206* (2013.01); *H04L 12/40039* (2013.01); *G06F 1/203* (2013.01)

(58) Field of Classification Search
CPC ..... H04B 3/54; H04L 12/40039; G06F 1/206; G06F 1/18; G06F 1/203
See application file for complete search history.

(56) References Cited

U.S. PATENT DOCUMENTS 3,252,123 A * 5/1966 Maps, Jr. ................ G06F 1/18
                                                          439/213
5,249,741 A   10/1993 Bistline et al.
(Continued)

FOREIGN PATENT DOCUMENTS

CN          1510697 A      7/2004
CN        101179601 A      5/2008
(Continued)

*Primary Examiner* — Kenneth Lam
(74) *Attorney, Agent, or Firm* — Leydig, Voit & Mayer, Ltd.

(57) ABSTRACT

A communications device is disclosed, the device includes a container, at least one power module, at least one temperature regulating module, and multiple boards. The container is configured to accommodate the at least one temperature regulating module and the multiple boards, and the container is further configured to accommodate a power bus layer. The power bus layer is connected to the at least one power module, the at least one temperature regulating module, and the multiple boards. The at least one power module is configured to supply power to the at least one temperature regulating module and the multiple boards by using the power bus layer. At least part of communication among the multiple boards, the at least one power module, and the at least one temperature regulating module is performed in a power line communications manner by using the power bus layer.

15 Claims, 11 Drawing Sheets

(51) Int. Cl.
*H04L 12/40* (2006.01)
*G06F 1/20* (2006.01)

(56) References Cited

U.S. PATENT DOCUMENTS

| | | | | |
|---|---|---|---|---|
| 2007/0081308 | A1* | 4/2007 | Ishida | H05K 7/1492 |
| | | | | 361/724 |
| 2009/0265045 | A1* | 10/2009 | Coxe, III | G06F 1/20 |
| | | | | 700/300 |
| 2011/0224837 | A1* | 9/2011 | Moss | G06F 1/206 |
| | | | | 700/295 |
| 2012/0116590 | A1* | 5/2012 | Florez-Larrahondo | |
| | | | | G06F 1/206 |
| | | | | 700/275 |
| 2012/0275084 | A1* | 11/2012 | Familiant | H04B 3/54 |
| | | | | 361/601 |
| 2012/0327591 | A1* | 12/2012 | Jau | H05K 7/1492 |
| | | | | 361/679.48 |
| 2013/0039004 | A1 | 2/2013 | Li et al. | |
| 2015/0071646 | A1* | 3/2015 | Jau | H04B 10/803 |
| | | | | 398/128 |
| 2015/0381237 | A1* | 12/2015 | Griffith | H04B 3/546 |
| | | | | 375/258 |

FOREIGN PATENT DOCUMENTS

| | | |
|---|---|---|
| CN | 102215628 A | 10/2011 |
| CN | 102841635 A | 12/2012 |
| CN | 102857348 A | 1/2013 |
| CN | 102929359 A | 2/2013 |
| CN | 103718658 A | 4/2014 |
| CN | 104582449 A | 4/2015 |
| EP | 1178584 A2 | 2/2002 |

\* cited by examiner

COMMUNICATIONS DEVICE AND BOARD USED IN COMMUNICATIONS DEVICE

CROSS-REFERENCE TO RELATED APPLICATIONS

This application is a continuation of International Application No. PCT/CN2016/070301, filed on Jan. 6, 2016, which claims priority to Chinese Patent Application No. 201510005712.7, filed on Jan. 6, 2015. The disclosures of the aforementioned applications are hereby incorporated by reference in their entireties.

TECHNICAL FIELD

The present invention relates to the field of communications technologies, and in particular, to a communications device and a board used in the communications device.

BACKGROUND

Referring to FIG. 1, FIG. 1 is a side view of a structure of a common communications device in the prior art. The communications device includes a cabinet. At least one chassis may be placed in the cabinet, and each chassis includes a backplane. For engineering reliability, each backplane and chassis are integrated. Multiple boards may be inserted in each chassis, and the multiple boards are connected to a power supply and a fan by using the backplane in the chassis. The multiple boards may include a service board and a switch board. The multiple boards may be inserted in the chassis in manners such as horizontal insertion and vertical insertion, and are connected to the backplane. The power supply and the fan are also connected to the backplane. Wires for interactive signals between the multiple boards and switching signals between the multiple boards and the power supply and between the multiple boards and the fan is disposed on the backplane, and communication is completed by using the backplane.

With increasing high requirements on capabilities of communications devices, more pins are used to connect each board, a power supply, and a fan to a backplane, and cabling on the backplane also becomes more complex. Consequently, design of a backplane is more complex, and design costs are increased.

SUMMARY

To resolve a problem in the prior art that design costs are increased due to high design complexity of a backplane, embodiments of the present invention provide a communications device and a board used in the communications device.

According to a first aspect, an embodiment of the present invention provides a communications device, including:

a container, at least one power module, at least one temperature regulating module, and multiple boards, where the container is configured to accommodate the at least one temperature regulating module and the multiple boards;

the container is further configured to accommodate a power bus layer;

the power bus layer is connected to the at least one power module, the at least one temperature regulating module, and the multiple boards;

the at least one power module is configured to supply power to the at least one temperature regulating module and the multiple boards by using the power bus layer; and at least part of communication among the multiple boards, the at least one power module, and the at least one temperature regulating module is performed in a power line communications manner by using the power bus layer.

In a first possible implementation of the first aspect, the at least part of communication among the multiple boards, the at least one power module, and the at least one temperature regulating module includes: board management communication between the multiple boards for performing control management.

With reference to the first aspect or the first possible implementation of the first aspect, in a second possible implementation, service communication related to service transmission between the multiple boards is performed by using a data interface outside the power bus layer.

With reference to the second possible implementation of the first aspect, in a third possible implementation, the data interface is one or more of a fiber interface or a high-speed cable interface; and the data interface is disposed on a front panel of the multiple boards.

In a fourth possible implementation of the first aspect, the at least part of communication among the multiple boards, the at least one power module, and the at least one temperature regulating module includes any one or a combination of the following:

power management communication between at least one of the multiple boards and at least one of the at least one power module for performing control management; and temperature regulating management communication between at least one of the multiple boards and at least one of the at least one temperature regulating module for performing control management.

With reference to the fourth possible implementation of the first aspect, in a fifth possible implementation, the at least part of communication among the multiple boards, the at least one power module, and the at least one temperature regulating module specifically includes any one or a combination of the following:

power management communication between the at least one of the multiple boards and all of the at least one power module for performing control management; and temperature regulating management communication between the at least one of the multiple boards and all of the at least one temperature regulating module for performing control management.

With reference to any one of the first aspect or the first to the fifth possible implementations of the first aspect, in a sixth possible implementation, a quantity of conducting layers of the power bus layer is a minimum quantity of conducting layers that are needed to supply power to the multiple boards.

With reference to any one of the first aspect or the first to the sixth possible implementations of the first aspect, in a seventh possible implementation, the communications device further includes:

multiple power connectors made of a rigid material, configured to connect the multiple boards, the at least one temperature regulating module, and the at least one power module to the power bus layer in a pluggable manner.

With reference to the seventh possible implementation of the first aspect, in an eighth possible implementation, each of the multiple boards, each of the at least one temperature regulating module, and each of the at least one power module include one power connector, and are connected to the power bus layer by using the power connector in the pluggable manner.

With reference to the seventh or the eighth possible implementation of the first aspect, in a ninth possible implementation, the power bus layer includes at least one long-strip-shaped power bus bar that has multiple tooth-like projections; and the power connectors are connected to the tooth-like projections on the power bus bar in the pluggable manner.

With reference to the ninth possible implementation of the first aspect, in a tenth possible implementation, the power bus layer includes multiple long-strip-shaped power bus bars, and the power bus layer further includes at least one conductive connector, configured to conduct conducting layers having a same polarity on the multiple power bus bars.

With reference to the tenth possible implementation of the first aspect, in an eleventh possible implementation, the power bus layer further includes at least one conversion connector, where the conversion connector is fixed on the power bus bar or the conductive connector, and is configured to connect to the power connector in the board, the power module, or the temperature regulating module, so that the board, the power module, or the temperature regulating module can be electrically conductive to the power bus bar or the conductive connector.

With reference to any one of the seventh to the eleventh possible implementations of the first aspect, in a twelfth possible implementation, a part that is of the power bus layer and that is connected to the power connector is in a flat structure; and the power connector includes two elastomers, where the two elastomers are configured to clamp and be electrically in contact with an upper surface and a lower surface of the flat structure, so as to connect the power connector to the power bus layer in the pluggable manner.

With reference to any one of the first aspect or the first to the twelfth possible implementations of the first aspect, in a thirteenth possible implementation, the communications device is not provided with a conventional backplane essentially.

With reference to any one of the first aspect or the first to the thirteenth possible implementations of the first aspect, in a fourteenth possible implementation, all low-speed communication of the communications device is performed in the power line communications manner by using the power bus layer; and all high-speed communication of the communications device is performed by using a high-speed interface that supports high-speed communication.

With reference to any one of the first aspect or the first to the fourteenth possible implementations of the first aspect, in a fifteenth possible implementation, at least one of the multiple boards, at least one of the at least one power module, or at least one of the at least one temperature regulating module includes: a slot ID module, where the slot ID module includes multiple Boolean signal generation mechanical parts and a control circuit; and the communications device further includes: an ID encoding mechanical part that is disposed in the container, where the ID encoding mechanical part includes a base and multiple matching parts that are disposed on the base, that are matched with the Boolean signal generation mechanical parts, and that meet a predefined encoding rule; and the base is fixedly disposed in the container, the multiple matching parts are configured to match the multiple Boolean signal generation mechanical parts to generate multiple Boolean signals, and the control circuit is configured to generate a slot ID according to the multiple generated Boolean signals.

With reference to the fifteenth possible implementation of the first aspect, in a sixteenth possible implementation, positions of the multiple matching parts are not fixed, and the encoding rule may be changed by adjusting the position or positions of one or more of the multiple matching parts.

With reference to any one of the first to the third possible implementations of the first aspect, in a seventeenth possible implementation, the at least part of communication among the multiple boards, the at least one power module, and the at least one temperature regulating module further includes any one or a combination of the following:

power management communication between at least one of the multiple boards and at least one of the at least one power module for performing control management; and temperature regulating management communication between at least one of the multiple boards and at least one of the at least one temperature regulating module for performing control management.

According to a second aspect, an embodiment of the present invention provides a board used in a communications device, where the communications device includes a container, at least one power module, at least one temperature regulating module, and multiple boards including the board, where the container is configured to accommodate the at least one temperature regulating module and the multiple boards; the container is further configured to accommodate a power bus layer; the power bus layer is connected to the at least one power module, the at least one temperature regulating module, and the multiple boards; the at least one power module is configured to supply power to the at least one temperature regulating module and the multiple boards by using the power bus layer; and the board includes:

a power line communications module, configured to perform communication with another board of the multiple boards, the at least one power module, and one or more of the at least one temperature regulating module in a power line communications manner by using the power bus layer; and a service processing module, configured to perform communication with the another board of the multiple boards by using a data interface outside the power bus layer.

In a first possible implementation of the second aspect, the communication that is performed by the power line communications module with the another board of the multiple boards, the at least one power module, and the one or more of the at least one temperature regulating module in the power line communications manner by using the power bus layer includes: board management communication that is performed with the another board of the multiple boards and that is used for control management.

With reference to the second aspect or the first possible implementation of the second aspect, in a second possible implementation, the data interface is one or more of a fiber interface or a high-speed cable interface; and the data interface is disposed on a front panel of the multiple boards.

In a third possible implementation of the second aspect, the communication that is performed by the power line communications module with the another board of the multiple boards, the at least one power module, and the one or more of the at least one temperature regulating module in the power line communications manner by using the power bus layer includes any one or a combination of the following:

power management communication for performing control management by the power line communications module on at least one of the at least one power module; and temperature regulating management communication for performing control management by the power line communications module on at least one of the at least one temperature regulating module.

With reference to the third possible implementation of the second aspect, in a fourth possible implementation, The communication that is performed by the power line communications module with the another board of the multiple boards, the at least one power module, and the one or more of the at least one temperature regulating module in the power line communications manner by using the power bus layer specifically includes any one or a combination of the following:

power management communication for performing control management by the power line communications module on all of the at least one power module; and temperature regulating management communication for performing control management by the power line communications module on all of the at least one temperature regulating module.

With reference to any one of the second aspect or the first to the fourth possible implementations of the second aspect, in a fifth possible implementation, the board includes a power connector made of a rigid material, where the power connector is configured to connect to the power bus layer in a pluggable manner; and the power line communications module is connected to the power connector, and is specifically configured to perform, by using the power connector, communication with the another board of the multiple boards in the power line communications manner by using the power bus layer.

With reference to the fifth possible implementation of the second aspect, in a sixth possible implementation, a part that is of the power bus layer and that is connected to the power connector is in a flat structure; and the power connector includes two elastomers, where the two elastomers are configured to clamp and be electrically in contact with an upper surface and a lower surface of the flat structure, so as to connect the power connector to the power bus layer in the pluggable manner.

With reference to any one of the second aspect or the first to the sixth possible implementations of the second aspect, in a seventh possible implementation, the board further includes:

a slot ID module, where the slot ID module includes multiple Boolean signal generation mechanical parts and a control circuit, where the communications device further includes: an ID encoding mechanical part that is disposed in the container, where the ID encoding mechanical part includes a base and multiple matching parts that are disposed on the base, that are matched with the Boolean signal generation mechanical parts, and that meet a predefined encoding rule; and the base is fixedly disposed in the container, the multiple matching parts are configured to match the multiple Boolean signal generation mechanical parts to generate multiple Boolean signals, and the control circuit is configured to generate a slot ID according to the multiple generated Boolean signals.

With reference to any one of the first or the second possible implementation of the second aspect, in an eighth possible implementation, the communication that is performed by the power line communications module with the another board of the multiple boards, the at least one power module, and the one or more of the at least one temperature regulating module in the power line communications manner by using the power bus layer includes any one or a combination of the following:

power management communication for performing control management by the power line communications module on at least one of the at least one power module; and temperature regulating management communication for performing control management by the power line communications module on at least one of the at least one temperature regulating module.

According to the embodiments of the present invention, part of communication is performed in a power line communications manner by using a power bus layer, so as to reduce backplane complexity or even cancel a backplane. In addition, in the embodiments of the present invention, a structure of the power bus layer may be designed to be a form (for example, a toothed power bus bar is connected to a power connector in a clamping manner) in which each part (a board, a temperature regulating module, or a power module) can be easily plugged and unplugged, and the form has a low tolerance requirement, so as to reduce a failure possibility of a device while facilitating use, thereby reducing maintenance costs.

BRIEF DESCRIPTION OF DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the objectives, technical solutions, and advantages of the present invention clearer and more comprehensible, the following further describes the present invention in detail with reference to specific embodiments and related accompanying drawings.

Embodiment 1

Figure 1:
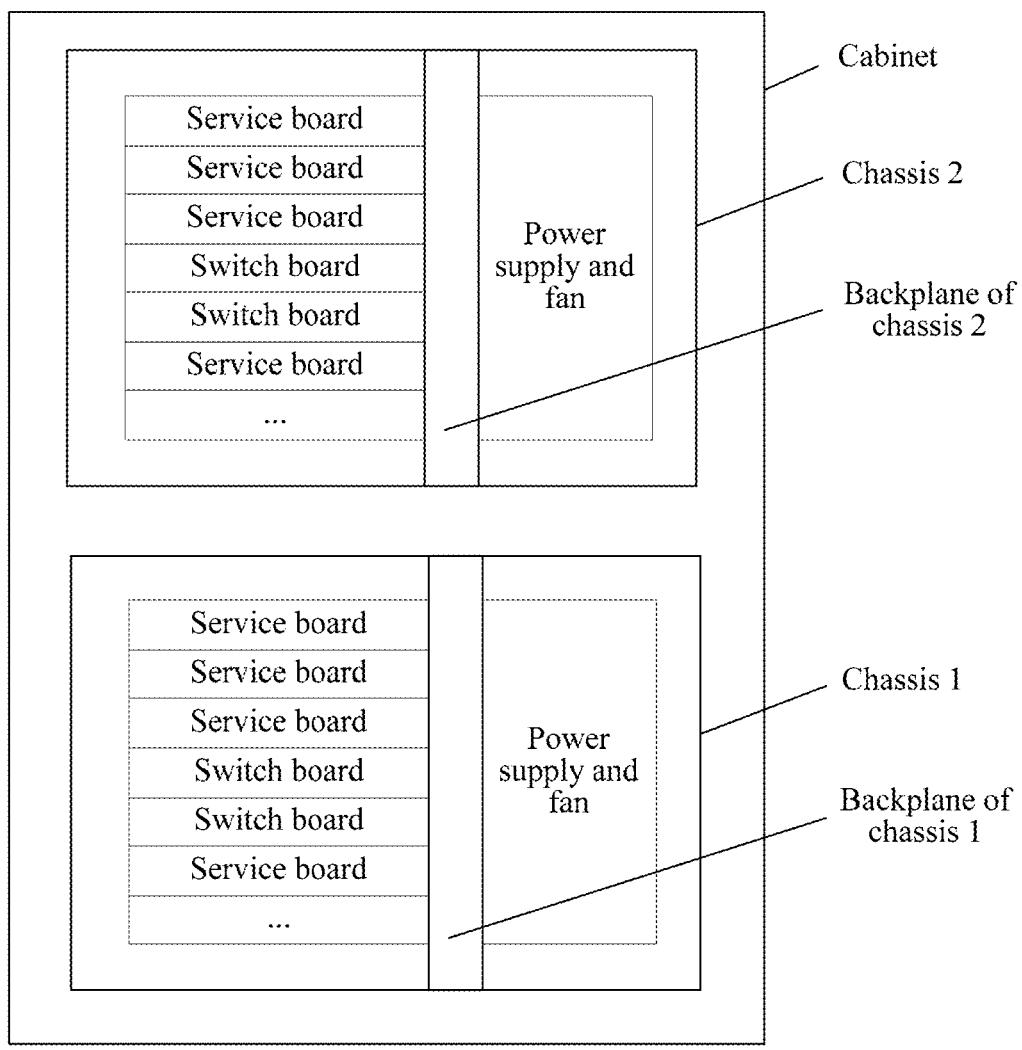
FIG. 1 is a schematic structural diagram of a communications device in the prior art.
Figure 2:
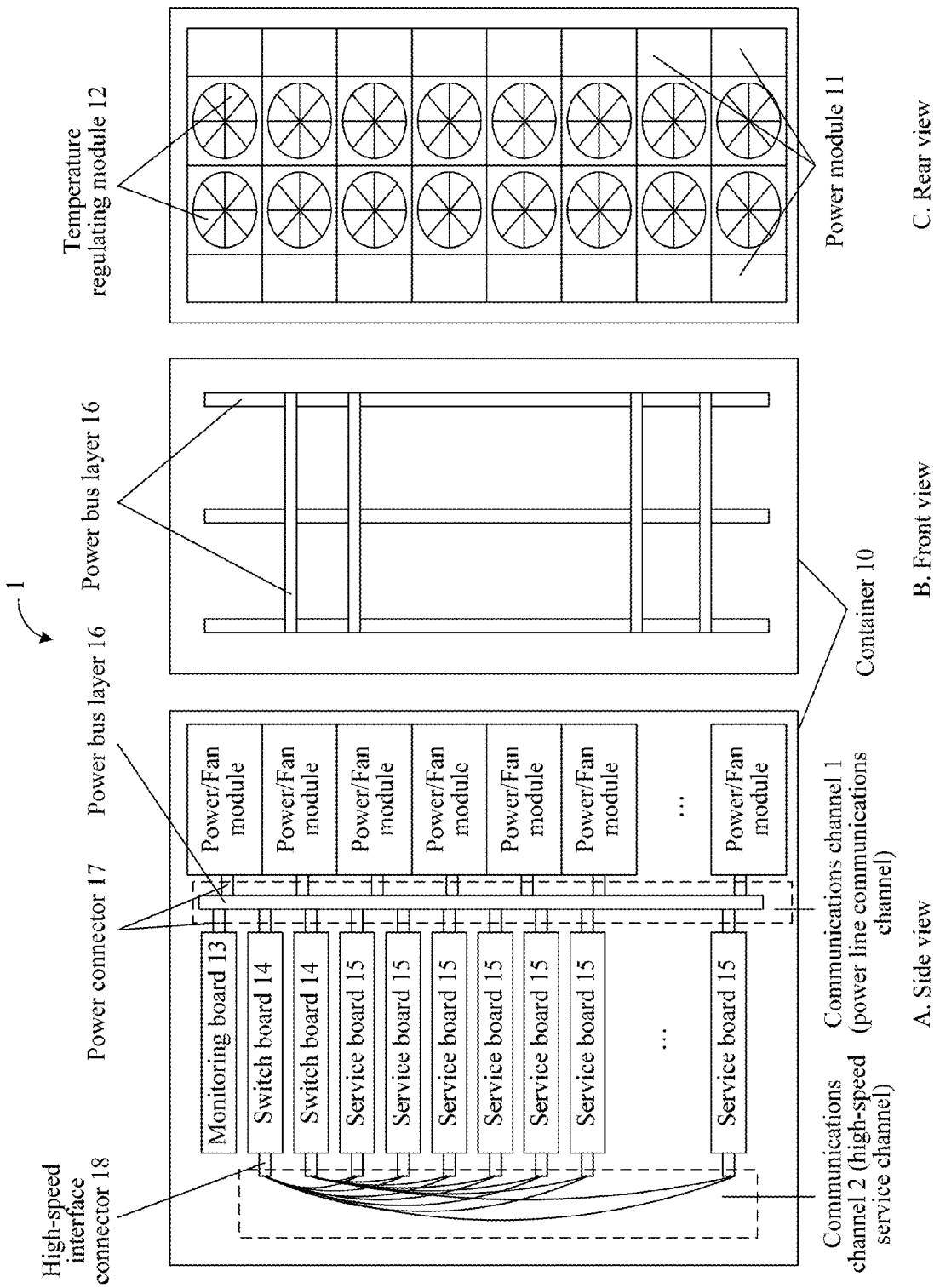
FIG. 2 is a schematic structural diagram of a communications device according to Embodiment 1 of the present invention.

Referring to FIG. 2, this embodiment of the present invention provides a communications device 1, including: a container 10, at least one power module 11, at least one temperature regulating module 12, and multiple boards 13, 14, and 15. The temperature regulating module may be a device that can cool the device, for example, a fan or an air conditioner. A fan module 12 is generally used when a volume is limited, and use of a device such as an air conditioner or a water cooling apparatus is not limited if the volume is not limited. For convenience of illustration, in this embodiment and the following embodiments, a fan module is used to replace the temperature regulating module for description. A container is configured to accommodate at least one power module, at least one fan module, and multiple boards. Like in the prior art, the container is a bearing unit that is configured to accommodate a part such as a board, a fan module, or a power module, and may be a chassis (chassis) or a cabinet (cabinet) that is commonly used in the prior art. Generally, in the communications field, a chassis is a container that is smaller than a cabinet. Related standards are made for the chassis and the cabinet separately. Certainly, in this embodiment and other all embodiments of the present invention, another known or unknown implementation that is used to provide similar functions according to a non-standard or a new standard in future is not limited. In some scenarios (for example, a data center) in which a large volume of data needs to be processed, in the present invention and other all embodiments, a cabinet is preferably used as the container, so that more parts may be borne by fully using a volume advantage of the cabinet.

Function types of the multiple boards are the same as those of a board in the prior art. For example, one or more switch boards 14 and multiple service boards 15 may be included, or a monitoring board 13 that is used for management and monitoring of the device may be further included. A topological connection relationship between the boards may also be based on various existing connection relationships, for example, a star connection shown in FIG. 2, and two switch boards are mutually backed up. In addition, the boards may also be inserted in the container in manners such as horizontal insertion and vertical insertion like in the prior art. An overall position of the boards, the multiple power modules, and the multiple fan modules may also be consistent with that in the prior art. For example, the boards are located on a front side of the container, and the power modules and the fan modules are located on a rear side of the container. Certainly, in another embodiment of the present invention, some boards that are inserted in the container in forms of rear boards are not limited.

In this embodiment of the present invention, the communications device further includes a power bus layer 16. The power bus layer 16 is located between a front side part (for example, the multiple boards) and a rear side part (for example, the power modules, the fans, or the rear boards) in the container, and is configured to connect the front side part and the rear side part.

In this embodiment of the present invention, the power bus layer 16 is connected to at least one power module, at least one fan module, and multiple boards. Specifically, each board, each power module, and each fan module are provided with one power connector 17, and are connected to the power bus layer by using the power connector 17. Certainly, a scenario in which some parts (for example, two fan modules) share one power connector is not limited in this embodiment of the present invention. Specific structures of the power bus layer may be various. For details, refer to the description in Embodiment 2.

In this embodiment of the present invention, the at least one power module is configured to supply power to the at least one fan module and the multiple boards by using the power bus layer; and part of communication between the multiple boards is performed in a power line communications manner by using the power bus layer, and the other part of communication is performed by using a communications channel that does not pass through the power bus layer.

The part of communication performed between the multiple boards in the power line communications manner by using the power bus layer includes: board management communication between the multiple boards for performing control management. In this embodiment and other embodiments, the communication between the boards refers to communication meeting a network topology relationship. The board management communication performed between the multiple boards may specifically refer to that a board (for example, a board having a control function) collects various types of status information (for example, collect temperatures of the boards) reported by the boards, and performs control management according to the collected status information (for example, give an alarm if it is found that a temperature is excessively high). Generally, a volume of data generated during the board management communication is relatively small, and a required transmission rate is relatively low (for example, several hundred Mbps). The board management communication is generally referred to as "low-bandwidth communication" or "low-speed communication". A bandwidth and a transmission rate that can be reached by communication performed in the power line communications manner by using the power bus layer can meet requirements of the low-speed communication. Therefore, the board management communication may be performed in the power line communications manner by using the power bus layer.

The other part of communication performed between the multiple boards by using the communications channel that does not pass through the power bus layer includes: service communication for service transmission that is performed between the boards by using a high-speed interface, for example, service communication that is performed by using a data interface supporting high-speed communication such as a fiber interface or a high-speed cable interface. Compared with the board management communication, service communication may generate a large volume of data, and a required transmission rate is relatively high (for example, above 1 Gbps). The service communication is generally referred to as "high-bandwidth communication" or "high-speed communication". Preferably, the entire communications device is not provided with a conventional backplane essentially. The "conventional backplane" herein refers to a backplane that is implemented by using a PCB in the prior art and that is used for various handshaking. The "essentially without provision" herein refers to that no conventional backplane needs to be provided from the perspective of system optimization. In some scenarios, for example, a compensation solution after an error occurs in a design, or some worse solutions that are used to avoid patent risks (a specific small part of signals are connected by using a conventional backplane), the conventional backplane may also be provided, but the conventional backplane is not provided from the perspective of optimization. Therefore, such provision of the conventional backplane also belongs to the scope of "essentially without provision".

Optionally, in this embodiment of the present invention, communication between at least one of the multiple boards and at least one of the at least one power module and communication between at least one of the multiple boards and at least one of the at least one fan module are performed in the power line communications manner by using the power bus layer.

The communication between at least one of the multiple boards and at least one of the at least one power module includes: power management communication between the at least one of the multiple boards and the at least one of the at least one power module for performing control management, for example, controlling power output of the power module according to system load.

The communication between at least one of the multiple boards and at least one of the at least one fan module includes: fan management communication between the at least one of the multiple boards and the at least one of the at least one fan module for performing control management, for example, increasing a fan speed when it is detected that the board is overheated.

A volume of data generated during the power management communication and the fan management communication is also small, so that the power management communication and the fan management communication also belong to the "low-bandwidth communication" or the "low-speed communication".

In this embodiment of the present invention, not all communication between the parts is performed by using the backplane, and part of the communication is performed in the power line communications manner by using the power bus layer, so as to reduce design complexity of the backplane, and reduce design costs.

In addition, in the prior art, because signals are increased, a quantity of signal pins in a connector of the backplane is also increased accordingly. If a pin is damaged, the entire connector cannot be used. However, the connector itself is generally fixed on the backplane in a crimping manner, and cannot be replaced individually. Therefore, when a damaged connector needs to be replaced, the entire backplane needs to be replaced. When the backplane is updated, to ensure a high precision requirement on installation of the backplane, generally, an entire chassis or cabinet with the backplane needs to be transported to a professional repair department (for example, a manufacturer) for update. Consequently, maintenance costs are increased.

In a preferred solution of the present invention, there may be completely no backplane, low-bandwidth communication is performed in a power line communications manner by using a power bus layer, and high-bandwidth communication is performed by using a high-speed communication interface, so as to greatly alleviate a problem of high maintenance costs of boards in the prior art.

Embodiment 2

Based on the foregoing embodiment, implementation of hardware of a communications device is specifically described in this embodiment of the present invention.

Various implementation forms of a power bus layer are described in Embodiment 1, and in this embodiment of the present invention, a specific form of a power bus layer is specifically described. In this embodiment of the present invention, a function of the power bus layer is the same as that in Embodiment 1. The power bus layer is configured to transmit power signals and other signals carried on the power signals in a power line communications manner. Because the power signals generally include only two signals: positive and negative power signals during physical transmission, the power bus layer needs to provide only two conductive paths.

Figure 3:
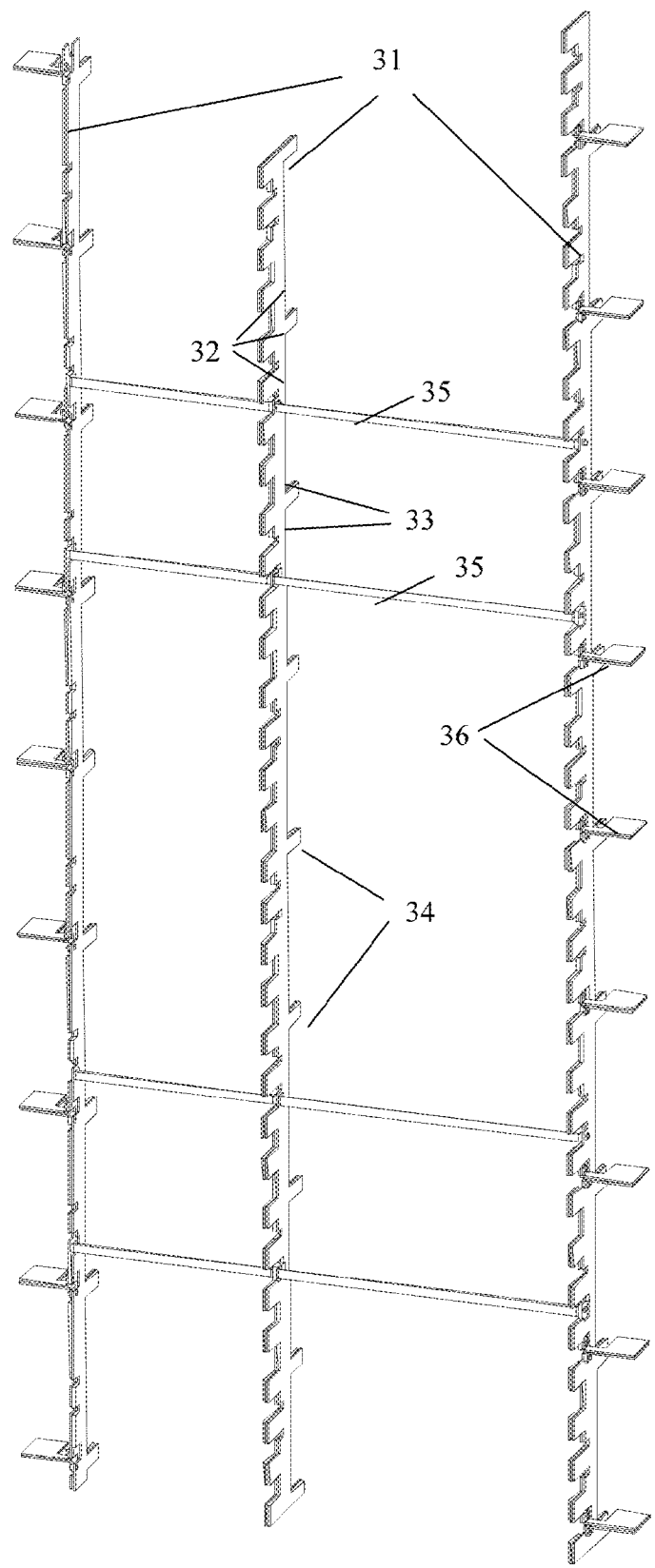
FIG. 3 is a schematic structural diagram of a power bus layer according to Embodiment 2 of the present invention.
Figure 4:
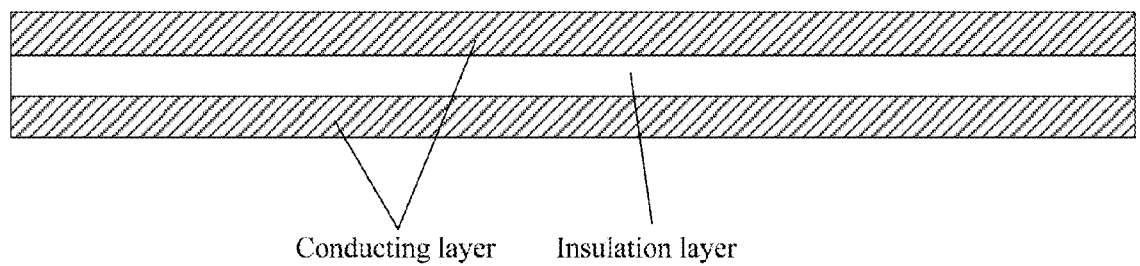
FIG. 4 is a cross sectional schematic view of a power bus bar according to Embodiment 2 of the present invention.

Referring to FIG. 3, FIG. 3 is a schematic structural diagram of a power bus layer. In this embodiment of the present invention, a quantity of conducting layers of the power bus layer is a minimum quantity of conducting layers that are needed to supply power to multiple boards. Power signals usually include only two signals: positive and negative power signals. Therefore, only two conducting layers need to be provided. To facilitate connecting to multiple parts and manufacturing, the power bus layer may include multiple power bus bars 31. Referring to FIG. 4, FIG. 4 is a cross sectional schematic view of the power bus bar according to this embodiment of the present invention. The power bus bar mainly includes upper and lower conducting layers and a sandwiched insulation layer. The upper conducting layer may transmit a signal from a positive pole of a power supply, and accordingly, the lower conducting layer may be used to transmit a signal from a negative pole of the power supply. For selection of materials, the conducting layers may be made of various conducting materials such as copper and aluminum. A material of the insulation layer is not limited, as long as the insulation layer can electrically insulate the upper and lower conducting layers. Selection of the materials is a technology known by a person skilled in the art, and details are not described herein. In addition, surfaces of the two conducting layers may be coated with an insulating paint to prevent electric shock.

A plane shape of the power bus bar is not limited, and the "plane shape" herein refers to a shape that is formed with a neglected thickness. For example, the plane shape may be a regular shape (for example, a rectangle or an ellipse), or may be an irregular shape (for example, a rectangle with gaps in regular or irregular shapes). Preferably, to facilitate manufacturing, a shape based on a rectangle may be selected. In addition, a height, a length, an area, and so on of each mechanical part of the power bus bar are not specifically limited in this embodiment of the present invention, as long as the power bus bar can be connected to parts needing to be connected (a board, a power module, and a fan module).

Referring to FIG. 3, to facilitate fixing connection, to prevent the parts connected to the power bus bar from interfering with each other, and to improve security of insertion and removal (for example, reduce electric arcs during insertion and removal), the power bus bar may be designed to be a tooth-like structure. That is, each place in which the power bus bar is connected to a part has gaps 32 at two sides, so that the power bus bar is in a structure having multiple tooth-like projections. A place in which the power bus bar is connected to a front side part (for example, a board) is a front tooth 33, and a place in which the power bus bar is connected to a rear side part is a rear tooth 34. To facilitate manufacturing, a shape of the gap may be a rectangle. Certainly, use of another shape is also not limited.

A quantity and positions of the power bus bars are not limited either, and may be determined according to positions and a quantity of parts needing to be connected. For example, after each part is inserted in a cabinet, connectors are located at a same side, only one power bus bar needs to be disposed, and all the parts are connected to the power bus bar by means of front and rear insertion. If the parts are inserted in the cabinet and are separately located at left, middle, and right sides of the cabinet, three power bus bars may be disposed at the left, middle, and right sides of the cabinet respectively.

Figure 5:
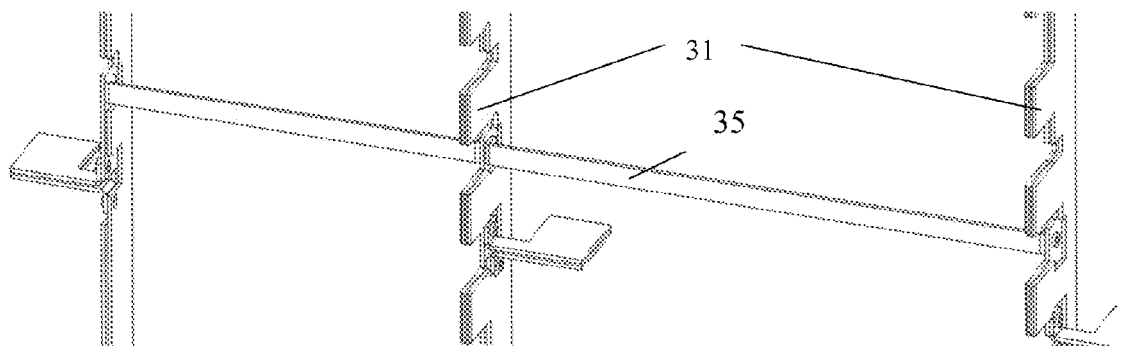
FIG. 5 is a schematic structural diagram of a conductive connector according to Embodiment 2 of the present invention.

Referring to FIG. 3, a power bus layer in FIG. 5 may further include one or more conductive connectors 35, configured to conduct conducting layers having a same polarity on multiple power bus bars. That is, positive and negative poles of power signals in each power bus bar are separately connected, so as to form a unified power transmission channel. Because only the power signals of the power bus bars need to be connected, a design requirement of a conductive connector becomes very low, and various manners may be used to implement the conductive connector. For example, a simplest manner is that the conductive connector may be a conductive metal (for example, a copper bar), and is connected to a signal layer (for example, a positive pole) of the power bus bars in various existing connection manners such as clamping, screwing, bonding, inserting-connection, and welding. In addition, a structure of the conductive connector may also be similar to the structure of the power bus layer, and includes two conducting layers that are isolated from each other, where the two conducting layers are separately connected to corresponding conducting layers of the power bus bars. Specific implementation methods of these connections are technologies known by a person skilled in the art. For example, connection may be performed by means of screw fixation shown in FIG. 5 (note: in FIG. 5, a conducting layer that is located around a junction in the power bus bar and that has a different polarity and a sandwiched insulator are hollowed, to facilitate screwing a screw without conducting positive and negative signals).

Referring to FIG. 3, the power bus layer further includes a conversion connector 36. Compared with the power bus bar, a volume of the conversion connector is relatively small. The conversion connector may be connected to the power bus bar or the conductive connector by means of a fixation or removable manner, and is electrically conductive to the power bus bar or the conductive connector. Connection of another part (a board, a fan module, or a power module) to the power bus layer may be implemented by connecting to the conversion connector. An advantage of using the conversion connector is flexible use. For example, after some parts are inserted in the cabinet, when the parts cannot be directly connected to the power bus bar, indirect connection may be implemented by using the conversion connector.

A form of fixing the conversion connector to the power bus bar or another mechanical part is not limited either. For example, connection may be performed by means of a screw fixation manner in FIG. 6 (note: a junction also needs to be hollowed to prevent from conducting signals from the positive and negative poles).

In this embodiment of the present invention, the power bus layer is designed to be a form having multiple power bus bars and conductive connectors, so that there is a large empty region in the power bus layer, and wind from the fan module at the rear side passes through the region and flows to a region in which the boards at the front side are located, thereby increasing heat dissipation efficiency.

In this embodiment of the present invention, the parts (the boards, the power supply, and a fan) are connected to a power bus board by using a power connector 17. Each board, power module, and fan module are provided with one power connector, and are directly connected to the power bus board by using the power connector.

Preferably, the power connectors are connectors made of a rigid material, and are fixed on the parts. When a corresponding part is inserted in the cabinet, the part is connected to the power bus board by using the power connector. The rigid material herein refers to a material that is relatively hard and is less likely to be deformed, for example, a hard metal or a hard plastic. In another embodiment, a connector with a soft material may also be used. The "connector with a soft material" herein refers to a connector that is not fully made of a rigid material. For example, relatively soft materials such as a cable and a flexible printed circuit are used. An advantage of using the connector made of a rigid material is easy insertion and removal. When an operator inserts each part, the operator needs to only push the part towards a side of the power bus layer, to connect part to the power bus board. Reversely, the entire part may be removed by applying an opposing force during removal.

A physical connection manner of the power connector and the power bus layer may be implemented by means of a manner such as inserting-connection and clamping. Based on an implementation of the power bus layer shown in FIG. 3, correspondingly, in this embodiment of the present invention, the power connector is preferably connected by means of clamping.

Figure 7:
FIG. 7 is a schematic structural diagram of a power connector according to Embodiment 2 of the present invention.

Referring to FIG. 7, FIG. 7 is a schematic diagram of the power connector according to this embodiment of the present invention. A side on which the power connector is connected to the power bus layer includes two elastomers that can conduct electricity and be respectively in contact with the positive and negative poles of the power bus layer (left and right sides of a tooth-like object clamping the power bus bar shown in FIG. 3). In addition, the two elastomers are separately connected to the board by using two pins that are led by means of signal cabling (not shown in the figure) in the power connector. A specific implementation is the prior art, and details are not described herein. The power connector designed by using this method has a large tolerance capability, so that precision requirements on insertion and removal of parts such as a board, a power supply, and a fan are reduced, thereby improving system reliability and reducing maintenance costs. In addition, design is simple, implementation is easy, and costs are low.

Figure 8:
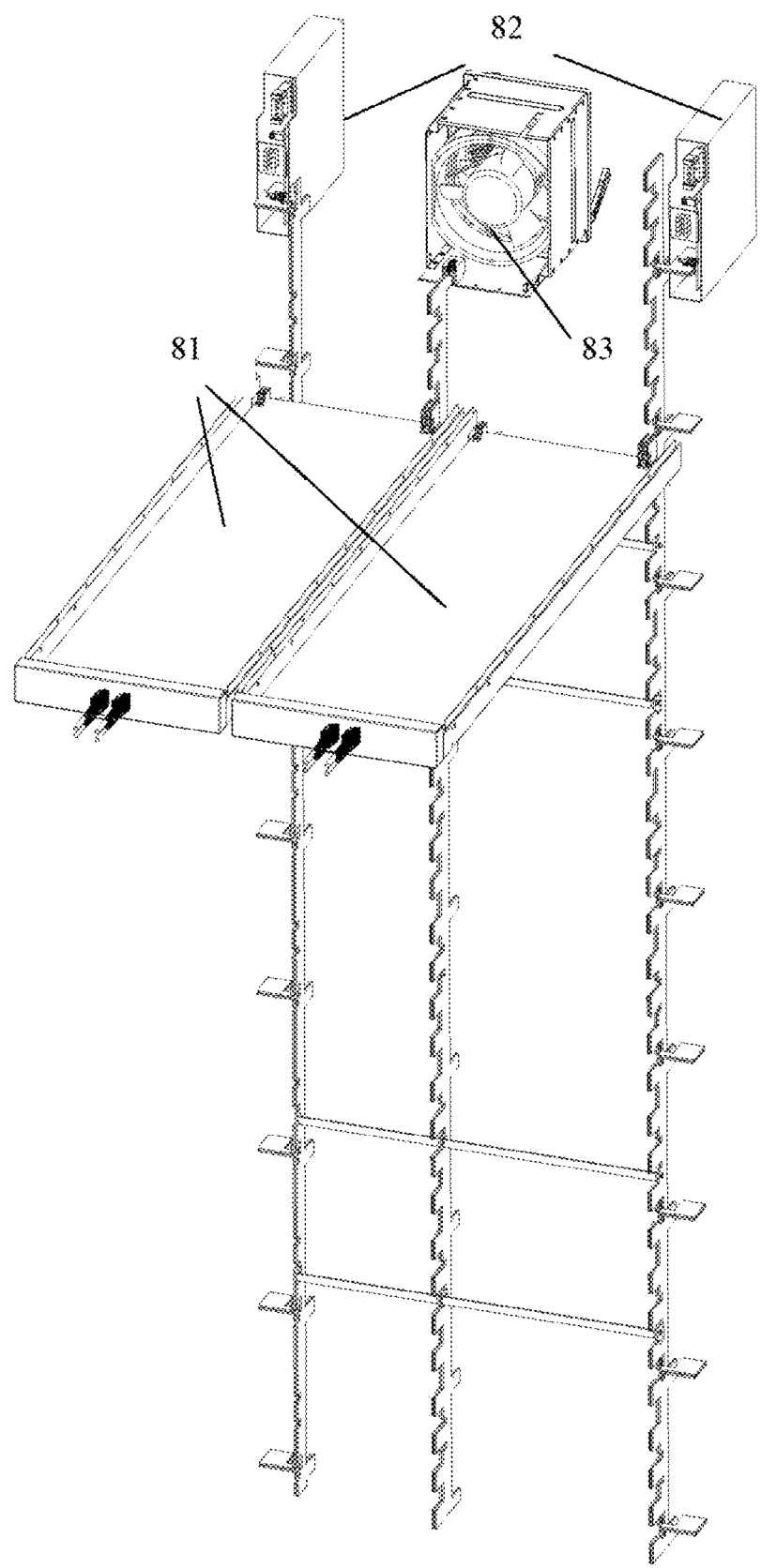
FIG. 8 is a schematic diagram of connection of each part to a power bus layer according to Embodiment 2 of the present invention.

Referring to FIG. 8, FIG. 8 is a schematic diagram of a specific connection relationship of the power bus layer and each part according to this embodiment of the present invention. In FIG. 8, boards 81 are inserted in the cabinet from a front side of the cabinet in a horizontal insertion manner, power modules 82 are inserted in the cabinet from two rear sides of the cabinet, and a fan module 83 is inserted in the cabinet from a middle rear side of the cabinet. In this case, three power bus bars may be separately disposed between the multiple boards and the power modules (or the fan module) in a direction of a cabinet height. The power bus bars on two sides are configured to connect to the power modules located at the rear sides of the cabinet and the boards located at the front side of the cabinet. A single-width board at the right side shown in the figure is connected to the power bus bar at the right side shown in the figure. If the board is a full-width board, the board may be optionally connected to only the power bus bar at one side (for example, the board is connected to the power bus bar at the right side, the middle side, or the left side shown in the figure). Certainly, the foregoing description is only a specific implementation. In another embodiment, one of the boards may also be connected to a middle power bus bar, or one or more power bus bars may be disposed to connect to one or more boards, fan modules, or power modules. A person skilled in the art may specifically design a power bus layer according to design requirements with reference to the foregoing example.

Each power bus bar has a tooth-like structure. A tooth may be opened at the front side, or may be opened at the rear side. As shown in FIG. 8, front teeth are disposed at the front side and are configured to connect to the boards located at the front side of the cabinet; and rear teeth are opened at the rear side and are configured to connect to the fan module.

To electrically conduct the power bus bars, four conductive connectors are disposed in FIG. 8. Certainly, another quantity of conductive connectors may also be disposed.

Figure 6:
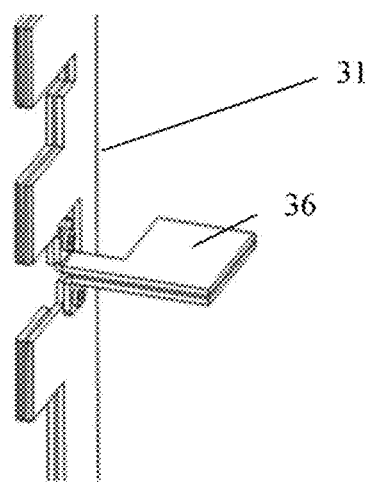
FIG. 6 is a schematic structural diagram of a conversion connector according to Embodiment 2 of the present invention.

The power module shown in FIG. 8 uses the power connector shown in FIG. 7. When the power module is inserted in the cabinet, the power connector on the power module is located in a position in which a horizontally-arranged mechanical part needs to be connected to the power connector. In this case, because the power bus bars are vertically arranged and cannot cramp the power connector on the power module, in a solution of FIG. 8, a solution in which connection is performed by using a conversion connector is used to implement indirection connection to the power bus bar. As shown in FIG. 8 and FIG. 6, the conversion connector is fixed at one side of the power bus bar by means of screw fixation, and is connected to the power connector of the power module.

It should be noted that the foregoing situations focus on description of a case in which there are two power signals (positive and negative poles). In another embodiment, if there are three or more power signals, only one additional signal path isolated from first two signals needs to be disposed, and connection may be implemented in various existing connection manners. For example, if there are three power signals, three rows of parallel conductive strips may be disposed, a position of each conductive strip to be connected is provided with a socket, and the power connector may be disposed to be a form of a plug, so that the power connector is connected to the corresponding socket by means of inserting-connection. Alternatively, other various connection manners may be used. This is not limited herein.

In addition, to increase system security, several sets of independent power bus layers may be separately disposed by means of redundancy backup. Correspondingly, parts also need to be provided with corresponding connectors, to connect to the power bus layers.

Preferably, a communications channel that does not pass through a power bus layer and that is between the boards may be implemented by using a high-speed data interface. The "high-speed data interface" herein refers to an interface supporting high-speed transmission, for example, supporting a transmission rate of 1 Gbps and above. For example, a high-speed data interface such as a fiber interface and a high-speed cable interface (also referred to as high-speed cable interface) is used, and a transmission medium such as an optical fiber and a high-speed cable is used cooperatively to implement high-speed communication. These are all the prior art, and details are not described herein.

Embodiment 3

Figure 9:
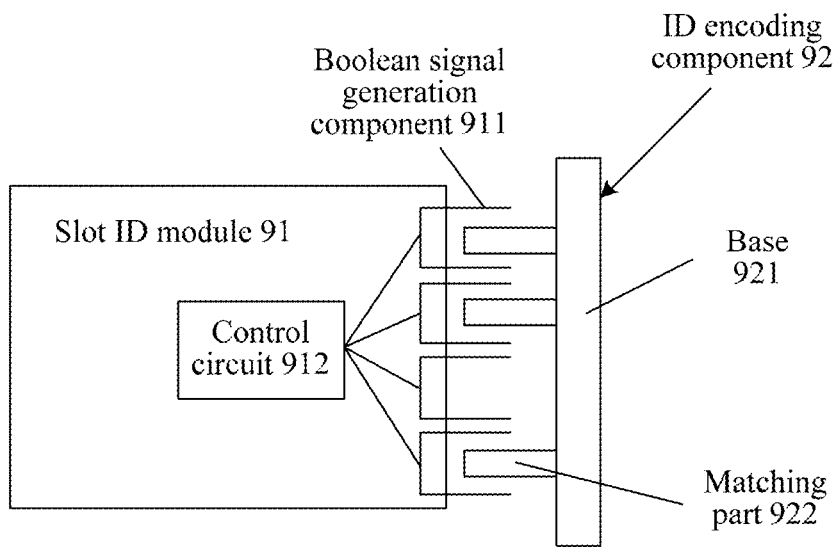
FIG. 9 is a schematic diagram of fitting of a slot ID module and an ID encoding mechanical part according to Embodiment 3 of the present invention.

Referring to FIG. 9, based on the foregoing embodiments, each part (a board, a power module, and a fan module) in a communications device provided in this embodiment of the present invention further includes a slot ID module 91, configured to generate a slot ID. A basic principle of the slot ID module is that some simple mechanical parts 911 (with some circuits) are configured to generate signals 0 and 1, and a control circuit 912 is configured to generate different slot IDs according to a generated 0 and 1 encoding combination. These simple mechanical parts are referred to as "Boolean signal generation mechanical parts 911" herein, for example, optical coupling modules or electrical signal connectors. Correspondingly, this embodiment of the present invention further includes an ID encoding mechanical part 92 disposed in a container. The ID encoding mechanical part includes a base 921 and multiple matching parts 922 that are disposed on the base, that are matched with the Boolean signal generation mechanical parts 911, and that meet a predefined encoding rule. The base is fixedly disposed in the container, the multiple matching parts 922 are configured to match the multiple Boolean signal generation mechanical parts 911 to generate multiple Boolean signals, and the control circuit is configured to generate the slot ID according to the multiple generated Boolean signals.

Figure 10A:
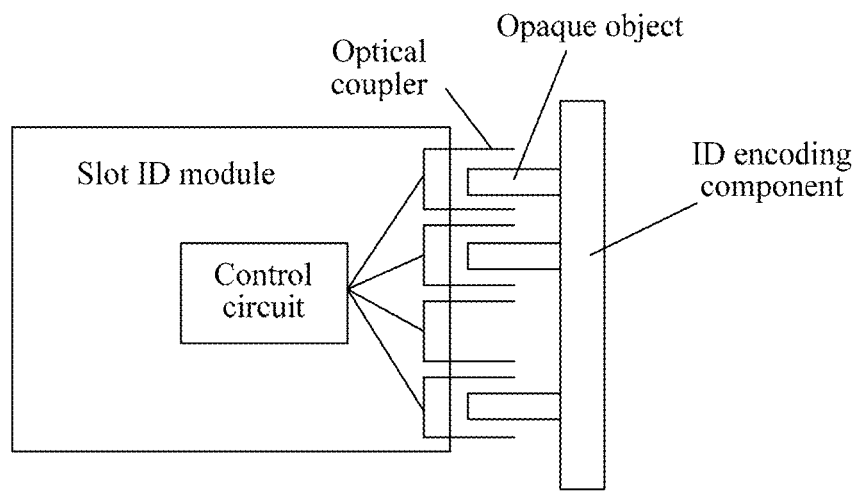
FIG. 10A is a schematic diagram of fitting of a slot ID module and an ID encoding mechanical part according to Embodiment 3 of the present invention.

For example, in this embodiment of the present invention, the slot ID module may include multiple optical couplers. A quantity of the optical couplers is determined according to a quantity of digits needed by a slot ID. For example, if a four-digit ID is needed, four optical couplers may be used. As shown in FIG. 10A, the optical coupler is a signal detector that is commonly used in the prior art, and mainly includes a light emitting unit (not shown in the figure), a light sensitive unit (not shown in the figure), and a control circuit. When an object is inserted in a groove of the optical coupler, the object may block a channel between the light emitting unit and the light sensitive unit of the optical coupler, and the control circuit can generate a signal (for example, "1") accordingly. Conversely, if there is no object to block the channel between the light emitting unit and the light sensitive unit of the optical coupler, the control circuit can generate another signal (for example, "0"). An advantage of using the optical coupler is that a signal can be detected without physical contact on an object, and the coupler cannot be damaged due to a physical operation such as insertion and removal, so as to improve system reliability.

Figure 10B:
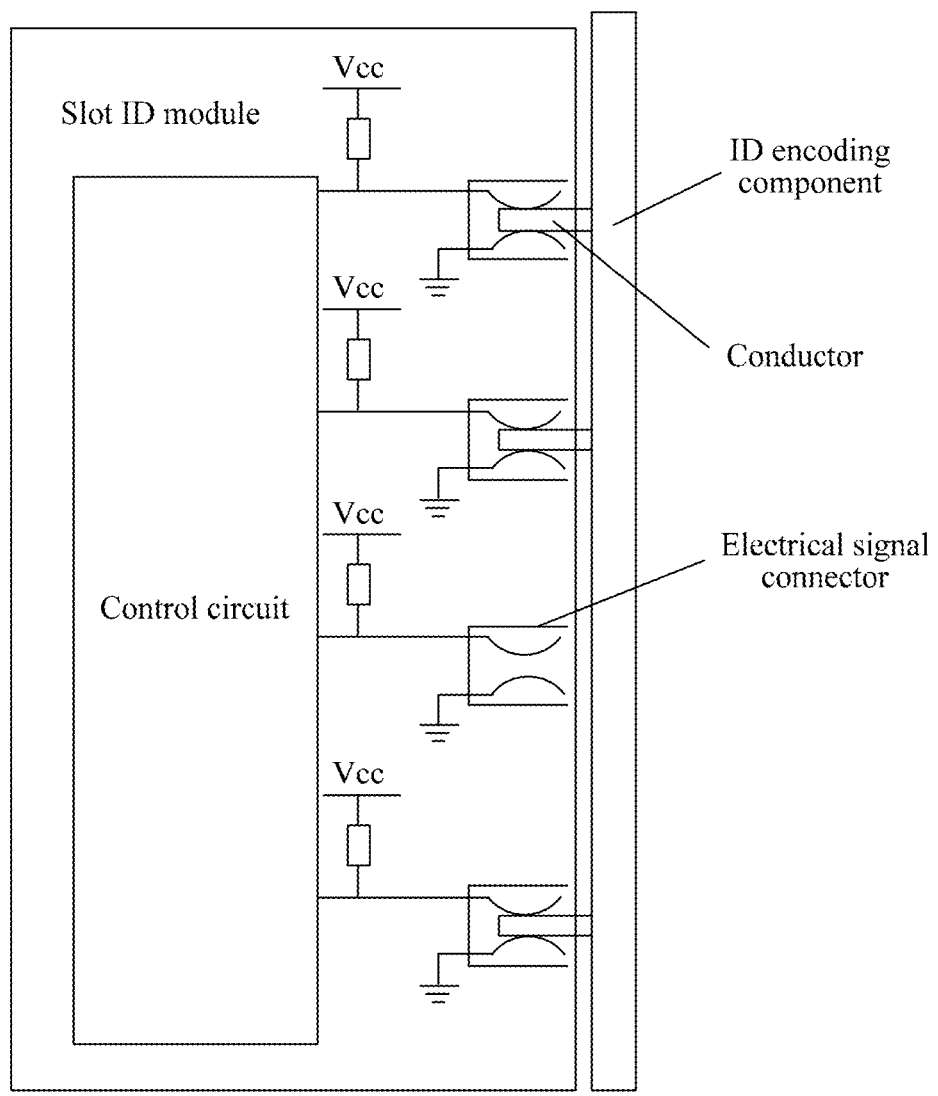
FIG. 10B is a schematic diagram of fitting of another slot ID module and an ID encoding mechanical part according to Embodiment 3 of the present invention.

Referring to FIG. 10B, in another embodiment, the slot ID module may further include multiple electrical signal connectors and a corresponding control circuit. A quantity of the electrical signal connectors is also determined according to a quantity of digits needed by a slot ID. An operating principle of the electrical signal connector is similar to that of the optical coupler. When the electrical signal connector is electrically conducted, a signal is generated; and conversely, another signal is generated.

To fit the foregoing various slot ID modules, the communications device in this embodiment of the present invention further include an ID encoding mechanical part. A junction in which the ID encoding mechanical part is connected to the slot ID module of each part is provided with zero, one or more fitting parts that fit the slot ID module. A signal change of the slot ID module is caused by means of fitting of these fitting parts and the slot ID module, so as to output the slot ID.

For example, if the slot ID module is implemented based on the optical coupler, the fitting part may be an opaque object that can prevent an optical signal from passing through the object, for example, an opaque plank, metal, and plastic. When a slot ID "1101" needs to be implemented, three matching parts that respectively correspond to a first optical coupler, a second optical coupler, and a fourth optical coupler may be disposed. When the part is inserted in the cabinet, the fitting part may block an optical channel, causing a change of an electrical signal, and generating a slot signal. Similarly, if the slot ID module is implemented based on the electrical signal connector, the fitting part may be a conductor, for example, various conductive metal sheets. These specific implementations are technologies known by a person skilled in the art, and details are not described herein.

In this embodiment of the present invention, a slot ID of each slot may be fixed, or may be flexibly configurable. Correspondingly, a fixation manner or a flexibly configurable manner may be used for the ID encoding mechanical part.

The fixation manner refers to that the ID encoding mechanical part is fixed in the cabinet, and generally, a position and shape of the ID encoding mechanical part may not be changed. In this way, the slot ID of each slot is fixed. A specific fixation manner is a technology known by a person skilled in the art. For example, the ID encoding mechanical part may be fixed in an existing mechanical part (for example, a power bus bar) or some other newly designed mechanical parts in various manners, may be made as an integral part for fixation, may be divided into several parts for separate fixation, or the like. Details are not described herein.

An advantage of using the fixation manner is to facilitate use by an operator for subsequent on-site installation and maintenance. The operator does not need to configure slot IDs on site, and only needs to insert related parts in the cabinet to obtain the slot IDs. It is convenient to use.

The flexibly configurable manner refers to that the ID encoding mechanical part is not fixed at a position in the cabinet, a volume is relatively small (the ID encoding mechanical part only needs to fit the slot ID module), and the ID encoding mechanical part is connected to the slot ID module in a pluggable manner. The matching part in the ID encoding mechanical part may be fixed, or may be adjustable (for example, the matching part is concealed or displayed by means of forward and backward pushes or upward and downward flips). When the slot ID is set to a particular slot ID, a model-specific ID encoding mechanical part is selected or the ID encoding mechanical part is adjusted to a form corresponding to the slot ID, and the ID encoding mechanical part is inserted in an ID encoding module to obtain the slot ID.

An advantage of using the flexibly configurable manner is that the slot ID is not fixed, and one or more slot IDs may be set to the particular slot ID according to actual requirements.

Certainly, a combination of the two manners is not limited in another embodiment. For example, an ID encoding mechanical part is fixed in a cabinet, and a matching part in the ID encoding mechanical part is adjustable (for example, the matching part is concealed or displayed by means of forward and backward pushes or upward and downward flips). The matching parts may be adjusted to a particular slot ID in advance according to an encoding requirement. By default, this encoding rule is used. In this case, an operator does not need to manually install the ID encoding mechanical parts, but only needs to insert a part in the cabinet to obtain a slot number. If there is a requirement for changing the encoding rule subsequently, each slot ID may be changed by displaying or concealing a corresponding matching part. After the change is completed, the slot ID may be obtained conveniently by means of a simple operation of inserting and removing the part. Specific implementation of the foregoing method is a technology known by a person skilled in the art, and details are not described herein.

Embodiment 4

Based on the foregoing embodiments, each part of a communications device is described in this embodiment of the present invention. As described in the foregoing embodiments, the part may be a board, a fan module, or a power module.

To implement power line communication (PLC), each part 40 needs to have a PLC module 41. The PLC module is configured to modulate a data signal that needs to be transmitted to outside of the part and then transmit the modulated data signal by using a power bus layer; or demodulate a power signal that is transmitted from outside of the part, to obtain a data signal carried on the power signal.

Figure 11:
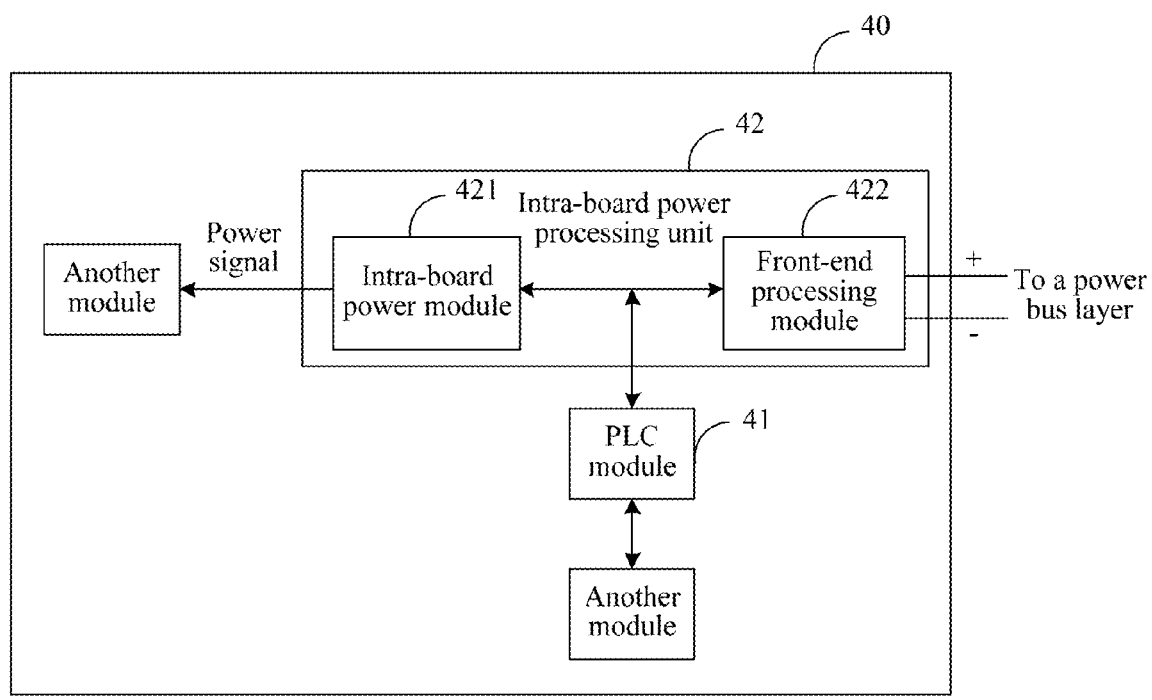
FIG. 11 is a schematic diagram of a board according to Embodiment 4 of the present invention.

Referring to FIG. 11, the part 40 further includes an intra-board power processing unit 42. The PLC module 41 is connected to the intra-board power processing unit 42, and interacts with the power bus layer by using the intra-board power processing unit 42.

The intra-board power processing unit includes an intra-board power module 421 and a front-end processing module 422. The front-end processing module 422 is an analog circuit that consists of some discrete devices (for example, a resistor, a capacitor, and an inductor) and that is used for processing a signal from a front end (one end nearest the power bus layer) of a power supply, including but not limited to one or more of the following circuits: a filter circuit, a soft-start circuit, a lightning protection circuit, and an EMC protection circuit. The intra-board power module 421 is configured to perform power conversion, to convert an input power supply (for example, 45 V) into a power supply (for example, 12 V or 5 V) needed by each device. The intra-board power module is generally a module that is relatively independent, solely packaged, and independent in a physical form. Certainly, an intra-board power module that is manufactured in another manner is not limited in this embodiment of the present invention.

When the PLC module 41 is connected to the intra-board power processing unit 42, the PLC module 41 may be specifically connected to the front-end processing module. During receiving of a power signal, the power signal is received from the front-end processing module. During sending of a power signal, the power signal is sent by using the front-end processing module.

Specific implementation (for example, how to implement modulation and demodulation of a signal) of the PLC module is the prior art, and details are not described in this embodiment of the present invention.

In this embodiment and other embodiments of the present invention, various other modules in the prior art may also be included. For example, referring to FIG. 12, a board at the left side of FIG. 12 may be a service board or a switch board. Each service board or switch board includes a processing module used for service processing and a monitoring management module used for monitoring management. The processing module processes a high-speed service by using a high-speed interface module. The monitoring management module is configured to collect one or more signals output from the slot ID module, the high-speed interface module, and the processing module, and finally output a monitoring management signal. The monitoring management signal is output, by using the PLC module and an intra-board power board via the power bus bar, to a monitoring management board that is specially disposed in a cabinet, or is output to a monitoring management module in a service board or switch board.

Figure 12:
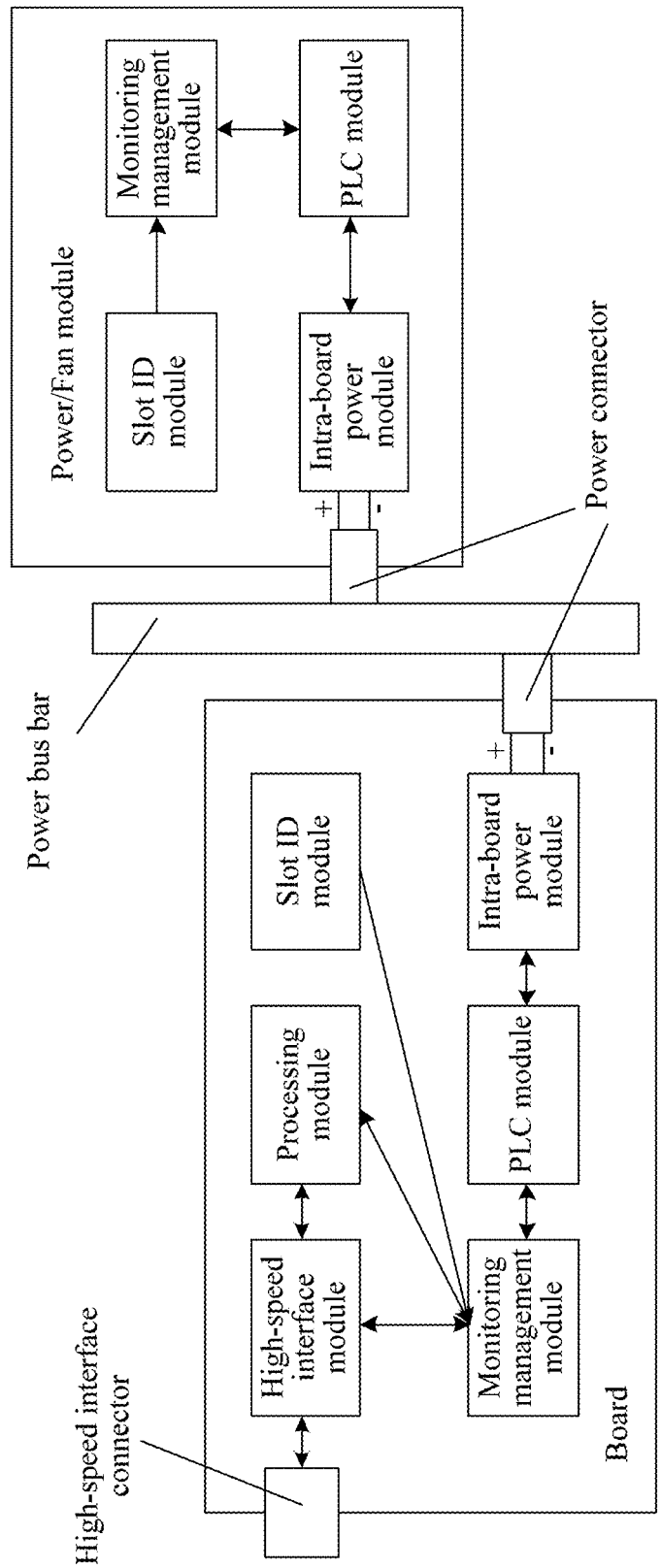
FIG. 12 is a schematic diagram of a board and a power/fan module according to Embodiment 4 of the present invention.
Figure 13:
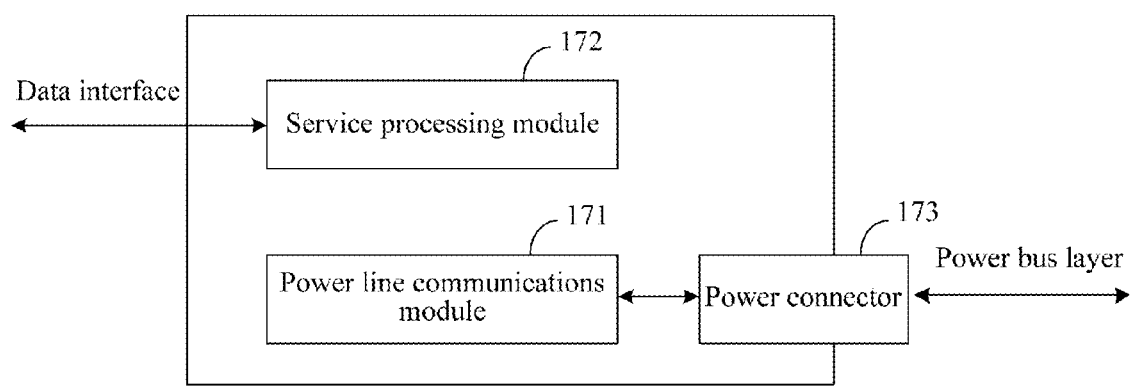
FIG. 13 is a schematic structural diagram of a board according to Embodiment 5 of the present invention.

Similarly, a power/fan module at the right side of FIG. 12 may also include a monitoring management module, configured to collect some control information (for example, a slot ID) in the board, and output, by using the PLC module and the intra-board power board via the power bus bar, related information to the monitoring management board that is specially disposed in the cabinet, or to a monitoring management module in a service board or switch board.

In another embodiment, each part may also include other intra-board power modules, and functions of the modules may also be varied. A person skilled in the art performs adaptive adjustment with reference to the specific examples given in this embodiment of the present invention, so that communication can be performed in a PLC manner by using the PLC module, or can be performed by using another interface (for example, a fiber interface or a cable interface).

Embodiment 5

Based on the foregoing embodiments, this embodiment of the present invention provides a board used in a communications device. The communications device includes a container, at least one power module, at least one temperature regulating module, and multiple boards including the board. The container is configured to accommodate the at least one temperature regulating module and the multiple boards, and the container is further configured to accommodate a power bus layer. The power bus layer is connected to the at least one power module, the at least one temperature regulating module, and the multiple boards. The at least one power module is configured to supply power to the at least one temperature regulating module and the multiple boards by using the power bus layer.

The board includes:

a power line communications module 171, configured to perform communication with another board of the multiple boards, the at least one power module, and one or more of the at least one temperature regulating module in a power line communications manner by using the power bus layer; and a service processing module 172, configured to perform communication with the another board of the multiple boards by using a data interface outside the power bus layer.

In this embodiment of the present invention, the communication that is performed by the power line communications module with the another board of the multiple boards, the at least one power module, and the one or more of the at least one temperature regulating module in the power line communications manner by using the power bus layer includes: board management communication that is performed with the another board of the multiple boards and that is used for control management.

In this embodiment of the present invention, the data interface is one or more of a fiber interface or a high-speed cable interface; and the data interface is disposed on a front panel of the multiple boards.

In this embodiment of the present invention, the communication that is performed by the power line communications module with the another board of the multiple boards, the at least one power module, and the one or more of the at least one temperature regulating module in the power line communications manner by using the power bus layer includes any one or a combination of the following:

power management communication for performing control management by the power line communications module on at least one of the at least one power module; and temperature regulating management communication for performing control management by the power line communications module on at least one of the at least one temperature regulating module.

In this embodiment of the present invention, the communication that is performed by the power line communications module with the another board of the multiple boards, the at least one power module, and the one or more of the at least one temperature regulating module in the power line communications manner by using the power bus layer specifically includes any one or a combination of the following:

power management communication for performing control management by the power line communications module on all of the at least one power module; and temperature regulating management communication for performing control management by the power line communications module on all of the at least one temperature regulating module.

In this embodiment of the present invention, the board includes a power connector 173 made of a rigid material, where the power connector is configured to connect to the power bus layer in a pluggable manner; and the power line communications module is connected to the power connector, and is specifically configured to perform, by using the power connector, communication with the another board of the multiple boards in the power line communications manner by using the power bus layer.

In this embodiment of the present invention, a part that is of the power bus layer and that is connected to the power connector is in a flat structure; and the power connector includes two elastomers, where the two elastomers are configured to clamp and be electrically in contact with an upper surface and a lower surface of the flat structure, so as to connect the power connector to the power bus layer in the pluggable manner.

In this embodiment of the present invention, the board further includes:

a slot ID module, where the slot ID module includes multiple Boolean signal generation mechanical parts and a control circuit, where the communications device further includes: an ID encoding mechanical part that is disposed in the container, where the ID encoding mechanical part includes a base and multiple matching parts that are disposed on the base, that are matched with the Boolean signal generation mechanical parts, and that meet a predefined encoding rule; and the base is fixedly disposed in the container, the multiple matching parts are configured to match the multiple Boolean signal generation mechanical parts to generate multiple Boolean signals, and the control circuit is configured to generate a slot ID according to the multiple generated Boolean signals.

For specific description of the modules in this embodiment of the present invention, refer to related chapters of the foregoing embodiments, and details are not described herein.

In addition, each module may be specifically implemented based on various universal or dedicated processing chips (for example, implemented by using a CPU, an FPGA, an ASIC, and the like). These are also technologies known by a person skilled in the art, and details are not described herein.

A person of ordinary skill in the art may understand that all or some of the processes of the methods in the embodiments may be implemented by a computer program instructing relevant hardware. The program may be stored in a computer readable storage medium. When the program is executed, the processes of the methods in the embodiments are performed. The foregoing storage medium may include: a magnetic disk, an optical disc, a read-only memory (Read-Only Memory, ROM), or a random access memory (Random Access Memory, RAM).

The foregoing examples of embodiments further describe the objectives, technical solutions, and advantages of the present invention. It should be understood that the foregoing descriptions are merely examples of embodiments of the present invention, but are not intended to limit the present invention. Any modification, equivalent replacement, or improvement made without departing from the spirit and principle of the present invention should fall within the protection scope of the present invention.

What is claimed is:

1. A communications device, comprising:
a container, at least one power module, at least one temperature regulating module, and multiple boards, wherein the container is configured to accommodate the at least one temperature regulating module and the multiple boards; wherein:
the container is further configured to accommodate a power bus layer;
the power bus layer is connected to the at least one power module, the at least one temperature regulating module, and the multiple boards;
the at least one power module is configured to supply power to the at least one temperature regulating module and the multiple boards by using the power bus layer; and
at least part of communication among the multiple boards, the at least one power module, and the at least one temperature regulating module is performed in a power line communications manner by using the power bus layer; and wherein:
the communications device further comprises multiple power connectors made of a rigid material, configured to connect the multiple boards, the at least one temperature regulating module, and the at least one power module to the power bus layer in a pluggable manner;
the power bus layer comprises at least one long-strip-shaped power bus bar that has multiple tooth-like projections; and
the power connectors are connected to the tooth-like projections on the power bus bar in the pluggable manner.

2. The communications device according to claim 1, wherein
the at least part of communication among the multiple boards, the at least one power module, and the at least one temperature regulating module comprises: board management communication between the multiple boards for performing control management.

3. The communications device according to claim 1, wherein
service communication related to service transmission between the multiple boards is performed by using a data interface outside the power bus layer.

4. The communications device according to claim 3, wherein
the data interface is one or more of a fiber interface or a high-speed cable interface; and
the data interface is disposed on a front panel of the multiple boards.

5. The communications device according to claim 1, wherein
the at least part of communication among the multiple boards, the at least one power module, and the at least one temperature regulating module comprises any one or a combination of the following:
power management communication between at least one of the multiple boards and at least one of the at least one power module for performing control management; and temperature regulating management communication between at least one of the multiple boards and at least one of the at least one temperature regulating module for performing control management.

6. The communications device according to claim 5, wherein
the at least part of communication among the multiple boards, the at least one power module, and the at least one temperature regulating module specifically comprises any one or a combination of the following:
power management communication between the at least one of the multiple boards and all of the at least one power module for performing control management; and temperature regulating management communication between the at least one of the multiple boards and all of the at least one temperature regulating module for performing control management.

7. The communications device according to claim 1, wherein
a quantity of conducting layers of the power bus layer is a minimum quantity of conducting layers that are needed to supply power to the multiple boards.

8. The communications device according to claim 1, wherein
each of the multiple boards, each of the at least one temperature regulating module, and each of the at least one power module comprise one power connector, and are connected to the power bus layer by using the power connector in the pluggable manner.

9. The communications device according to claim 1, wherein
the power bus layer comprises multiple long-strip-shaped power bus bars, and the power bus layer further comprises at least one conductive connector, configured to conduct conducting layers having a same polarity on the multiple power bus bars.

10. The communications device according to claim 9, wherein
the power bus layer further comprises at least one conversion connector, wherein the conversion connector is fixed on the power bus bar or the conductive connector, and is configured to connect to the power connector in the board, the power module, or the temperature regulating module, so that the board, the power module, or the temperature regulating module can be electrically conductive to the power bus bar or the conductive connector.

11. The communications device according to claim 1, wherein
a part that is of the power bus layer and that is connected to the power connector is in a flat structure; and
the power connector comprises two elastomers, wherein the two elastomers are configured to clamp and be electrically in contact with an upper surface and a lower surface of the flat structure, so as to connect the power connector to the power bus layer in the pluggable manner.

12. The communications device according to claim 1, wherein
the communications device is not provided with a conventional backplane essentially.

13. The communications device according to claim 1, wherein
all low-speed communication of the communications device is performed in the power line communications manner by using the power bus layer; and
all high-speed communication of the communications device is performed by using a high-speed interface that supports high-speed communication.

14. The communications device according to claim 1, wherein
at least one of the multiple boards, at least one of the at least one power module, or at least one of the at least one temperature regulating module comprises: a slot ID module, wherein the slot ID module comprises multiple Boolean signal generation mechanical parts and a control circuit; and
the communications device further comprises: an ID encoding mechanical part that is disposed in the container, wherein the ID encoding mechanical part comprises a base and multiple matching parts that are disposed on the base, that are matched with the Boolean signal generation mechanical parts, and that meet a predefined encoding rule; and the base is fixedly disposed in the container, the multiple matching parts are configured to match the multiple Boolean signal generation mechanical parts to generate multiple Boolean signals, and the control circuit is configured to generate a slot ID according to the multiple generated Boolean signals.

15. The communications device according to claim 14, wherein positions of the multiple matching parts are not fixed, and the encoding rule may be changed by adjusting the position or positions of one or more of the multiple matching parts.

* * * * *